United States Patent
Dahl et al.

(10) Patent No.: US 10,473,698 B2
(45) Date of Patent: Nov. 12, 2019

(54) VOLTAGE MONITOR

(71) Applicant: Nordic Semiconductor ASA, Trondheim (NO)

(72) Inventors: Hans Ola Dahl, Trondheim (NO); Sebastian Ioan Ene, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 21 days.

(21) Appl. No.: 15/736,764

(22) PCT Filed: Jun. 16, 2016

(86) PCT No.: PCT/GB2016/051788
§ 371 (c)(1),
(2) Date: Dec. 14, 2017

(87) PCT Pub. No.: WO2016/203235
PCT Pub. Date: Dec. 22, 2016

(65) Prior Publication Data
US 2018/0328966 A1    Nov. 15, 2018

(30) Foreign Application Priority Data
Jun. 16, 2015  (GB) .................................. 1510601.6

(51) Int. Cl.
*G01R 19/00*   (2006.01)
*G01R 19/165*  (2006.01)
(Continued)

(52) U.S. Cl.
CPC ...  *G01R 19/0038* (2013.01); *G01R 19/16519* (2013.01); *G01R 19/16538* (2013.01);
(Continued)

(58) Field of Classification Search
CPC .............................................. G01R 19/16538
See application file for complete search history.

(56) References Cited

U.S. PATENT DOCUMENTS

| 4,149,160 A | 4/1979 | Bozarth et al. |
| 4,590,391 A | 5/1986 | Valley |
(Continued)

FOREIGN PATENT DOCUMENTS

| EP | 0338489 A2 | 4/1989 |
| EP | 0902294 A1 | 3/1999 |
| JP | H 05215789 A | 8/1993 |

OTHER PUBLICATIONS

Patents Act 1977: Combined Search and Examination Report under Sections 17 and 18(3) for GB1800326.9, dated Jul. 10, 2018, 6 pages.
(Continued)

*Primary Examiner* — Clayton E. LaBalle
*Assistant Examiner* — Jas A Sanghera
(74) *Attorney, Agent, or Firm* — Klarquist Sparkman, LLP

(57) ABSTRACT

A voltage monitor circuit comprises: a monitored voltage input (42); a reference capacitor (32) arranged to be able to store a value of the monitored voltage as a reference capacitor voltage; a timeout capacitor (34) arranged to be able to store a value of the monitored voltage as a timeout capacitor voltage. The timeout capacitor undergoes a higher leakage than the reference capacitor. The voltage monitor circuit also comprises a comparator (2) arranged to: compare the monitored voltage to the reference capacitor voltage; compare the timeout capacitor voltage to the reference capacitor voltage; and produce a logic signal on an output (9) of the comparator based on said comparisons, the logic signal having a first logic value at least if the reference capacitor voltage is lower than or equal to both the monitored voltage and the timeout capacitor voltage.

20 Claims, 4 Drawing Sheets

(51) Int. Cl.
G06F 1/28 (2006.01)
H03K 5/24 (2006.01)
(52) U.S. Cl.
CPC ......... *G01R 19/16576* (2013.01); *G06F 1/28* (2013.01); *H03K 5/2481* (2013.01)

(56) References Cited

U.S. PATENT DOCUMENTS

| | | | |
|---|---|---|---|
| 5,245,223 A | | 9/1993 | Lim et al. |
| 5,296,753 A | * | 3/1994 | Nakadai ................. H03K 3/021 326/126 |
| 2007/0132486 A1 | | 6/2007 | O'Keefe |
| 2007/0279125 A1 | | 12/2007 | Tripathi et al. |

OTHER PUBLICATIONS

International Search Report and Written Opinion for PCT/GB2016/051788, dated Dec. 2, 2016, 18 pages.
Search Report under Section 17(5) for GB1510601.6, dated Dec. 4, 2015, 4 pages.

\* cited by examiner

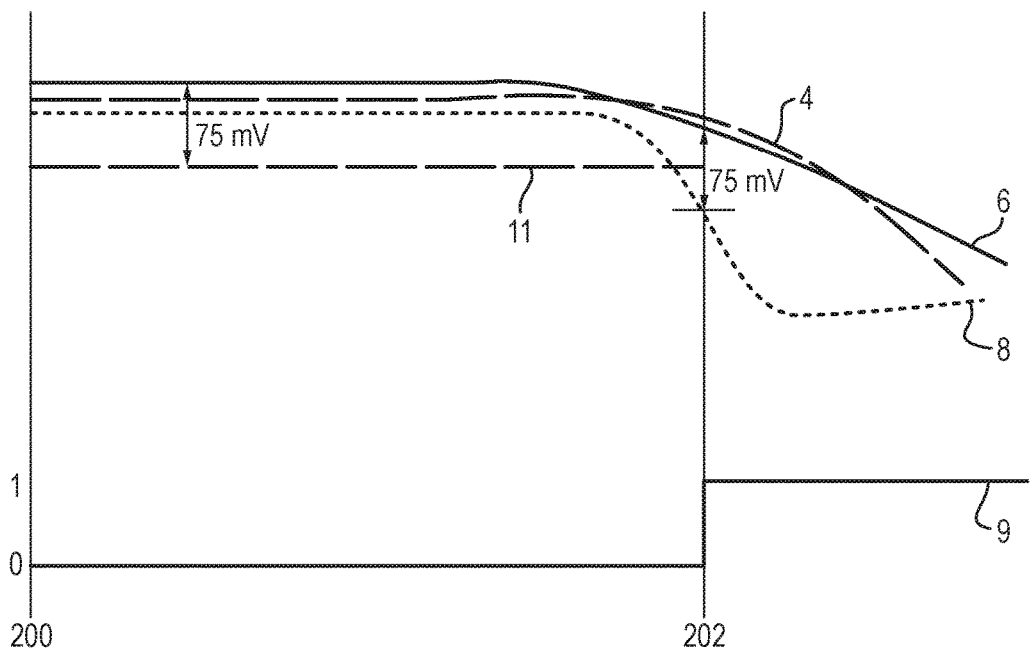

VOLTAGE MONITOR

CROSS REFERENCE TO RELATED APPLICATIONS

This is the U.S. National Stage of International Application No. PCT/GB2016/051788, filed Jun. 16, 2016, which was published in English under PCT Article 21(2), which in turn claims the benefit of Great Britain Application No. 1510601.6, filed Jun. 16, 2015.

The present invention relates to voltage monitor and comparator circuits, more particularly to digital voltage comparators.

It is often desirable to be able to monitor a voltage level, for example in order to detect a change in the level, or the level crossing a threshold. To this end, comparators are commonly used in order to make a comparison between two voltages or currents and output a particular digital value depending on which of the two is higher. For example if one voltage $V_+$ is greater than the other voltage $V_-$, such a comparator may output a digital "1" (i.e. logic high), but output a digital "0" (i.e. logic low) when the reverse is true.

In order to compare an input voltage with multiple reference voltages, it is conventional in the art to use a first comparator to compare the input voltage with one reference voltage, a second comparator to compare the input voltage with another reference voltage, and a Boolean logic gate (e.g. a logic OR gate) to combine the outputs of the first and second comparators. However, both comparators and Boolean logic gates are typically constructed from a number of transistors, and thus such an arrangement will have a greater power requirement than is desirable for low power applications such as smartphones, tablets and wearable technology.

The Applicant has also appreciated that when comparators are used to monitor input voltages that change only slowly, problems with drift in the reference voltage can be encountered.

When viewed from a first aspect, the present invention provides a voltage monitor circuit comprising:
  a monitored voltage input;
  a reference capacitor arranged to be able to store a value of the monitored voltage as a reference capacitor voltage;
  a timeout capacitor arranged to be able to store a value of the monitored voltage as a timeout capacitor voltage, said timeout capacitor undergoing a higher leakage than said reference capacitor; and
  a comparator arranged to:
    compare the monitored voltage to the reference capacitor voltage;
    compare the timeout capacitor voltage to the reference capacitor voltage; and
    produce a logic signal on an output of the comparator based on said comparisons, said logic signal having a first logic value at least if the reference capacitor voltage is lower than or equal to both the monitored voltage and the timeout capacitor voltage.

It will be appreciated by those skilled in the art that the present invention provides a voltage monitor that, by storing a value of the monitored voltage at a particular time as the reference capacitor voltage and subsequently comparing the value of the monitored voltage to the reference capacitor voltage, can detect changes in the level of the monitored voltage. By giving the timeout capacitor a higher leakage rate than the reference capacitor, a time limit is set, such that if the monitored voltage has not dropped below the reference capacitor voltage in an appropriate amount of time, the timeout capacitor voltage will have, which may be used to trigger a change in the output logic signal. This may obviate the effects of drift if the monitored voltage is only falling slowly.

In some embodiments, the output logic signal could have a second logic value as soon as the monitored voltage or the timeout capacitor voltage drops below the reference capacitor voltage. However, in a set of embodiments, the comparator is arranged such that the logic signal has a second logic value once the monitored voltage or the timeout capacitor voltage drops below the reference capacitor voltage by an offset voltage. This allows the voltage monitor circuit to allow for a ripple on the monitored voltage.

There are a number of possible ways in which it could be arranged that the timeout capacitor undergoes higher leakage, but in a set of embodiments a leakage transistor is connected in parallel with the timeout capacitor. This leakage transistor can advantageously and predictably provide the aforementioned "timeout" function, wherein a leakage current through the leakage transistor causes the timeout capacitor voltage to decrease slowly at a controlled rate. As discussed this may reduce issues with voltage drift that could potentially occur should it take a long time for the monitored voltage (i.e. the circuit input voltage) to drop below the reference capacitor voltage.

In a set of embodiments, the reference capacitor and the timeout capacitor are connected to the monitored voltage input via a switch. Those skilled in the art will appreciate that this arrangement provides a way of monitoring the circuit input voltage over time against a previous sampled value, stored on the reference capacitor. In a set of such embodiments, the voltage monitor circuit comprises a refresh input arranged to close the switch and connect the reference capacitor and the timeout capacitor to the monitored voltage input. This advantageous arrangement provides the voltage monitor circuit with a way of taking new samples of the circuit input voltage on the two capacitors when required.

There are a number of comparators that could provide the functionality outlined above. However, in an advantageous set of embodiments, the comparator comprises:
  a first portion including a first transistor with a gate terminal connected to the reference capacitor;
  a second portion in parallel with the first portion including a second transistor with a gate terminal connected to the monitored voltage and a third transistor with a gate terminal connected to the timeout capacitor, wherein said second and third transistors are in series; and
  a bistable portion connected to said first and second portions and arranged to produce said logic signal.

Such a comparator is novel and inventive in its own right and thus when viewed from a second aspect, the present invention provides a comparator comprising:
  a first portion including a first transistor with a gate terminal connected to a first input at a first input voltage;
  a second portion in parallel with the first portion including a second transistor with a gate terminal connected to a second input at a second input voltage and a third transistor with a gate terminal connected to a third input at a third input voltage, wherein said second and third transistors are in series;
  a bistable portion connected to said first and second portions and arranged to produce a logic signal on an output of the comparator, said logic signal having a first logic value at least if the first voltage is lower than or equal to both the second input voltage and the third input voltage Thus it will be appreciated by those skilled in the art that this aspect of the present invention provides a self-contained, multi-input comparator that can compare the voltage on the first input to the voltages on both the second and third inputs simultaneously. Current will typically flow asymmetrically through the first and second portions. More current will flow through the portion which is connected to the highest voltage at any given time. The bistable portion then causes the output of the comparator to saturate to either logic high or logic low. By "stacking" transistor pairs, multiple comparisons may be made within the same comparator. This advantageous arrangement can provide a significant reduction in power consumption compared to conventional arrangements using multiple comparators and Boolean logic gates. In some circumstances a reduction of 50% could be achieved.

When the comparator is used with the first aspect of the invention the first input is the reference capacitor, the second input is the monitored voltage and the third input is the timeout capacitor. References to the first, second or third inputs should therefore be construed appropriately in the context of the first aspect of the invention.

Those skilled in the art will also appreciate that either aspect of the present invention can be extended to utilise more than three inputs by adding additional series transistors to each of the first and second portions where appropriate.

The output may be taken from a node at which the bistable portion is connected to either the first or the second portion. The choice of where the output is taken from is not essential—it simply determines the polarity of the output achieved. In some embodiments, the output is connected to the second portion. In such embodiments, the first logic value may be a logic low and the second logic value a logic high value.

In some applications, it will be the case that a direct comparison between the nominal voltages present on the first input and the second and third inputs respectively will be desired. In such a case the output will switch to a second logic value (typically the inverse of the first logic value) logic signal if the second or third input falls below the first input. However, in a set of embodiments, the output does not switch unless the second or third input voltage falls below the first input voltage by at least an offset voltage. This may be achieved by using transistors of different physical sizes (e.g. different transistor widths) in the first and second portions respectively which gives an inherent asymmetry that causes the comparator to have a built-in offset voltage. In a set of embodiments therefore, the offset voltage is determined by a ratio of transistor sizes.

The first and second portions can be understood to form the two sides of a differential pair circuit. While it is possible to have a single transistor within the first portion and two transistors in the second portion, in a particular set of embodiments the first input is connected to a fourth transistor. In a set of embodiments, the first and fourth transistors are in series. In a set of embodiments, the gate terminals of the first and fourth transistors are connected. By keeping the number of transistors in each portion equal, the circuit may remain balanced, reducing the risk of any unwanted bias within the comparator that would have to be compensated for in use. Monte Carlo mismatch analysis has shown that better performance is obtained by arranging the differential pair circuit in this manner.

In a set of embodiments the comparator comprises a current source. In a set of embodiments, the current source is connected to source terminals of the first and third transistors.

There are a number of transistor technologies that could readily be employed for the transistors specified in accordance with the invention, including bipolar junction transistors (BJTs) and junction gate field-effect transistors (JFETs or JUGFETs). In a set of embodiments the comparator comprises one or more field-effect transistors (FETS). In a set of embodiments the comparator comprises one or more metal-oxide-semiconductor field-effect transistors (MOSFETS). In a set of embodiments, one or more of the first, second, third and optionally fourth transistors is an n-channel metal-oxide-semiconductor (NMOS) field-effect transistor. Where more transistors are provided, these may also be NMOSFETs.

A person skilled in the art will appreciate that the scope of the invention extends to all such transistor technologies, and the term "field-effect transistor" (FET) is understood to be encompass: metal-insulation-semiconductor field-effect transistors (MISFETs); insulated gate field-effect transistors (IGFETs); multiple gate field-effect transistors (MuGFETs); multiple independent gate field-effect transistors (MIGFETs); nonplanar, double-gate field-effect transistors with wrap-around silicon "fin" device bodies (FinFETs); and other field-effect transistor technologies not explicitly listed herein.

In a set of embodiments, a source terminal of the second transistor is connected to a drain terminal of the third transistor. This provides a series connection between the second and third transistors and allows current to flow therethrough, providing both transistors remain "on" (i.e. their gate-source voltages exceed their respective threshold voltages).

In a set of embodiments, a source terminal of the third transistor is connected to a source terminal of the first or optionally the fourth transistor. This provides a parallel connection between the first and second portions of the comparator.

In a set of embodiments, the bistable portion comprises a plurality of transistors. In a set of embodiments, the bistable portion comprises one or more metal-oxide-semiconductor field-effect transistors (MOSFETS). In a set of embodiments, the bistable portion comprises a plurality of p-channel metal-oxide-semiconductor (PMOS) field-effect transistors. Advantageous embodiments that include both NMOS (i.e. the first and second portions) and PMOS (i.e. the bistable portion) transistors—i.e. implementations that use complementary metal-oxide-semiconductor (CMOS) field-effect transistors—typically have better noise resistance and power consumption (both active and standy-by) characteristics than embodiments that use just one type of MOSFET or BJTs, as well as allowing for a greater package density to be achieved. However, a person skilled in the art will appreciate that an alternative implementation using PMOS transistors for the first and second portions and NMOS transistors for the bistable portion is within the scope of the present invention.

In a set of embodiments, the bistable portion comprises:
 a first bistable portion transistor with a drain terminal connected to a drain terminal of the first transistor and a gate terminal connected to a drain terminal of the second transistor; and a second bistable portion transistor with a drain terminal connected to a drain terminal of the second transistor and a gate terminal connected to a drain terminal of the first transistor.

This particular arrangement provides the comparator with a bistable output, i.e. the output value will "latch" to either logic high or logic low, depending on the comparison of the voltages connected to the first and second portions.

In a set of embodiments, the bistable portion further comprises:
a third bistable portion transistor with its gate and drain terminals connected to the drain terminal of the first bistable portion transistor; and
a fourth bistable portion transistor with its gate and drain terminals connected to the drain terminal of the second bistable portion transistor.

It will be appreciated by those skilled in the art that these additional transistors are each in a diode-connected arrangement, and form current mirrors such that the first and fourth bistable portion transistors form a first current mirror, and the second and third bistable portion transistors form a second current mirror.

In a set of embodiments, one or more of the group comprising the first, second, third and fourth bistable portion transistors is arranged such that its respective source terminal is connected to a power supply.

An embodiment of the invention will now be described, by way of example only, with reference to the accompanying drawings in which:

FIG. 4 is a timing diagram showing the advantage of the timeout capacitor of the voltage monitor of FIG. 2.

Figure 1:
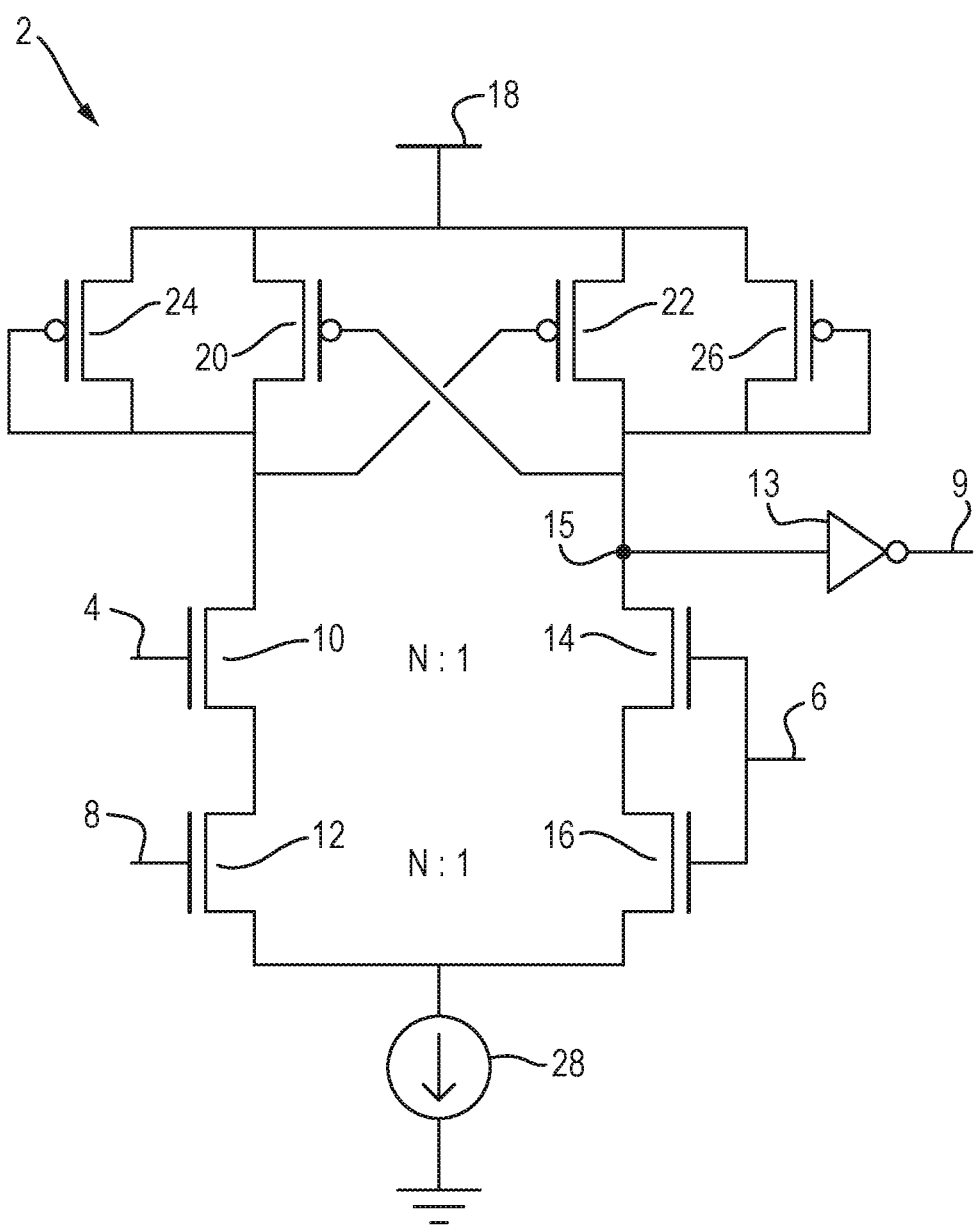
FIG. 1 is a circuit diagram of a three-input comparator in accordance with an embodiment of the invention.

FIG. 1 is a circuit diagram of a three-input comparator 2 in accordance with an embodiment of the invention. The comparator 2 has a monitor input 4, a reference input 6, a timeout input 8 and an output 9.

The monitor input 4 is connected to the gate terminal of a monitor NMOS transistor 10. The timeout input 8 is connected to the gate terminal of a timeout NMOS transistor 12. The monitor and timeout transistors 10, 12 are connected in series with one another, such that the source terminal of the monitor transistor 10 is connected to the drain terminal of the timeout transistor 12.

The reference input 6 is connected to the gate terminals of both upper and lower reference NMOS transistors 14, 16, which are connected in series with one another, such that the source terminal of the upper reference transistor 14 is connected to the drain terminal of the lower reference transistor 16. It will be appreciated that the designations 'upper' and 'lower' are merely used as labels and do not carry any other connotation.

The transistors 10, 12, 14, 16 are fabricated such that the monitor and timeout transistors 10, 12 on one side of the circuit have a physical width N times larger than that of the reference transistors 14, 16 on the other side of the circuit (where N is not necessarily an integer). In one specific example, N is chosen to be 2.75 (corresponding to an 11:4 ratio), providing the comparator with a built-in offset of 75 mV.

The source terminals of the timeout transistor 12 and the lower reference transistor 16 are connected to one another and to a current source 28.

A first bistable portion PMOS transistor 20 is arranged such that its source terminal is connected to the power supply rail 18, its drain terminal connected to the drain terminal of the monitor transistor 10 and its gate terminal is connected to the drain terminal of the upper reference transistor 14.

A second bistable portion PMOS transistor 22 is arranged such that its source terminal is connected to the power supply rail 18, its drain terminal connected to the drain terminal of the upper reference transistor 14, and its gate terminal is connected to the drain terminal of the monitor transistor 10.

A third bistable portion PMOS transistor 24 is connected such that its source terminal is connected to the power supply rail 18 and its gate and drain terminals are connected to both the drain terminal of the monitor transistor 10 and the gate terminal of the second bistable portion transistor 22.

A fourth bistable portion PMOS transistor 26 is connected such that its source terminal is connected to the power supply rail 18 and its gate and drain terminals are connected to both the drain terminal of the upper reference transistor 14 and the gate terminal of the first bistable portion transistor 20.

While this particular implementation utilises a single-ended output from node 15, in practice the output has to be amplified further to obtain a rail-to-rail logic signal at the output 9. This can be achieved using an inverting amplifier, since the voltage at node 15 becomes more negative as the voltage at the monitor input 4 and/or the timeout input 8 drop below the voltage at the reference input 6. For ease of illustration, this is simply shown as an inverter 13 that takes the voltage at node 15 and turns it into a logic signal of the correct polarity at the output 9. In an alternative implementation, the output from the comparator 2 is differential and is taken across node 15 (inverting output) and the drain terminal of the monitor transistor 10 (non-inverting output). This differential signal is then fed into a second amplifier stage which converts it into a rail-to-rail logic signal.

As will now be explained, in use the comparator 2 operates such that the output 9 is set to logic high whenever the voltage at either the monitor input 4 or the timeout input 8 drops below the voltage at the reference input 6 by more than the built-in offset, which in this example is 75 mV as mentioned above. When this occurs, current will flow asymmetrically through each side of the comparator. Specifically, more current will flow through the upper and lower reference NMOS transistors 14, 16 than through the monitor and timeout transistors 10, 12 despite the difference in physical size. As a consequence, the bistable portion PMOS transistors 20, 22, 24, 26 cause the output 9 of the comparator 2 to saturate to logic high.

Similarly, if the voltages at both the monitor input 4 and the timeout input 8 are the same as that at the reference input 6, or differ from it by less than the offset voltage, more current will flow through the monitor and timeout transistors 10, 12 than through the upper and lower reference NMOS transistors 14, 16. As a consequence, the bistable portion PMOS transistors 20, 22, 24, 26 cause the output 9 of the comparator 2 to saturate to logic low.

Figure 2:
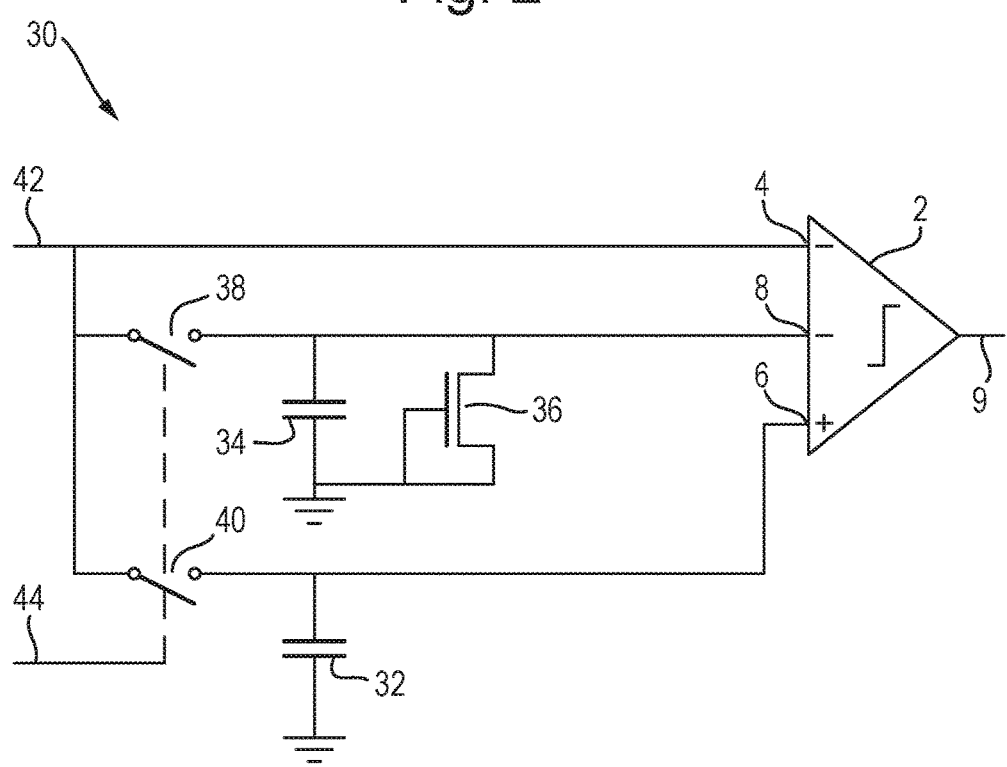
FIG. 2 is a circuit diagram of a voltage monitor that includes the comparator of FIG. 1.

FIG. 2 is a circuit diagram of a voltage monitor 30 that includes the comparator 2 of FIG. 1. The voltage monitor 30 also includes a reference capacitor 32 and a timeout capacitor 34. The voltage across the reference capacitor 32 provides the reference input 6 to the comparator 2; the voltage across the timeout capacitor 34 provides the timeout input 8 to the comparator 2; and a monitored input to the circuit 42 provides the monitor input 4 to the comparator 2.

A 'leakage' transistor 36 is diode-connected across the timeout capacitor 34 with its drain connected to one side of the capacitor 34 and its source and gate connected to the other side (and so to ground either directly or via a tie-low circuit). This causes a controlled leakage of charge from the timeout capacitor 34 as will be described below.

A first switch 38 and a second switch 40 selectively connect the monitored voltage input 42 to the timeout capacitor 34 and the reference capacitor 32 respectively.

In use a refresh signal 44 controlled by external logic (not shown) operates to close the first and second switches 38, 40 for a fixed time such that the reference and timeout capacitors 32, 34 are connected to the monitored input voltage 42 for long enough to charge the capacitors 32, 34 to the instantaneous input voltage 42. The refresh signal 44 then goes low again, opening the switches 38, 40. At this point the output 9 is at logic low.

The leakage transistor 36 permits a small leakage current to flow therethrough. This causes the voltage across the timeout capacitor 34 to decrease slowly over time. As explained further below with reference to FIG. 4, this prevents issues with voltage drift that could potentially occur should it take a long time for the monitored input voltage 42 to drop below the voltage on the reference input 6.

If the voltage at either the monitored input 42 or across the timeout capacitor 34 drops below the voltage across the reference capacitor 32 by more than the built-in offset, e.g. 75 mV as stated above, the output 9 is set to logic high as explained above with reference to FIG. 1. When the output 9 is set to logic high, the refresh signal 44 is also set to logic high, thereby restarting the operation described above.

Figure 3:
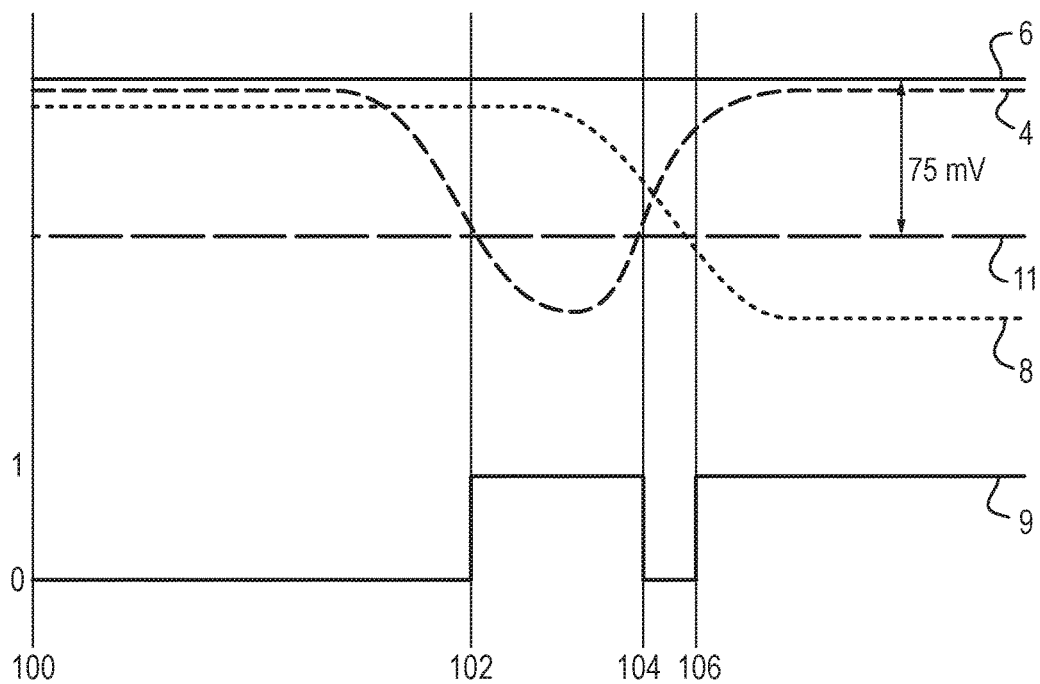
FIG. 3 is a timing diagram showing the relationship between the inputs and the output of the three-input comparator of FIG. 1.

FIG. 3 is a timing diagram showing the relationship between the inputs 4, 6, 8 and the output 9 of the three-input comparator 2 of FIG. 1. At an initial time 100, the monitor input 4, reference input 6 and the timeout input 8 are all charged to the value of the monitored circuit input voltage 42 and thus are substantially equal.

At a subsequent time 102, the voltage on the monitor input 4 has dropped below the threshold 11, which is 75 mV less than the voltage on the reference input 6 as described above. In accordance with the operation of the comparator circuit 2, the signal on the output 9 transitions from logic low to logic high at this time.

The voltage on the monitor input 4 then increases above the threshold 11 at time 104, causing the signal on the output 9 to revert to logic low.

Later, at time 106, the voltage on the timeout input 8 has decreased below the threshold 11. Again, the comparator 2 operates as previously described, and the output signal 9 transitions to logic high once more.

FIG. 4 is a timing diagram showing the advantage of the timeout capacitor 34 of the voltage monitor 30 of FIG. 2. In this instance, the monitor input 4 is decreasing at such a slow rate, that the voltage on the reference input 6 begins to drift. This is due to leakage on the reference capacitor 32. Thus, even if the voltage on the monitor input 4 were to drop to a value more than 75 mV below its original value (i.e. the value which was stored across the reference capacitor 32 at an initial time 200), despite having crossed the intended threshold 11, the comparator 2 would not create a transition to logic high on the output 9.

However, due to the leakage transistor 36, the timeout capacitor 34 leaks current at a greater rate than the reference capacitor 32. This causes the voltage on the timeout input 8 to decrease in a known way, such that at time 202, the output 9 will undergo a transition to logic high even if the voltage on the monitor input 4 has not decreased below the voltage on the reference input 6 by more than 75 mV yet. As previously mentioned, this will cause a refresh of the monitoring circuit (storing new values on the capacitors 32, 34).

Thus it will be seen that a voltage monitor circuit and associated three-input comparator suited to low power applications has been described which allow a falling voltage to be monitored against a threshold whilst guarding against issues which might arise from drift. Although a particular embodiment has been described in detail, it will be appreciated by those skilled in the art that many variations and modifications are possible using the principles of the invention set out herein.

The invention claimed is:

1. A voltage monitor circuit comprising:
    a monitored voltage input;
    a reference capacitor arranged to be able to store a value of the monitored voltage as a reference capacitor voltage;
    a timeout capacitor arranged to be able to store a value of the monitored voltage as a timeout capacitor voltage, said timeout capacitor undergoing a higher leakage than said reference capacitor; and
    a comparator arranged to:
    compare the monitored voltage to the reference capacitor voltage;
    compare the timeout capacitor voltage to the reference capacitor voltage; and
    produce a logic signal on an output of the comparator based on said comparisons, said logic signal having a first logic value at least if the reference capacitor voltage is lower than or equal to both the monitored voltage and the timeout capacitor voltage.

2. The voltage monitor circuit as claimed in claim 1, wherein the comparator is arranged such that said logic signal has a second logic value once the monitored voltage or the timeout capacitor voltage drops below the reference capacitor voltage by an offset voltage.

3. The voltage monitor circuit as claimed in claim 2, wherein the offset voltage is determined by a ratio of transistor sizes.

4. The voltage monitor circuit as claimed in claim 1 comprising a leakage transistor connected in parallel with the timeout capacitor.

5. The voltage monitor circuit as claimed in claim 1, wherein the reference capacitor and the timeout capacitor are connected to the monitored voltage input via a switch.

6. The voltage monitor circuit as claimed in claim 5, wherein the voltage monitor circuit comprises a refresh input arranged to close the switch and connect the reference capacitor and the timeout capacitor to the monitored voltage input.

7. The voltage monitor circuit as claimed in claim 1, wherein the comparator comprises:
    a first portion including a first transistor with a gate terminal connected to the reference capacitor;
    a second portion in parallel with the first portion including a second transistor with a gate terminal connected to the monitored voltage and a third transistor with a gate terminal connected to the timeout capacitor, wherein said second and third transistors are in series; and
    a bistable portion connected to said first and second portions and arranged to produce said logic signal.

8. The voltage monitor circuit as claimed in claim 7, wherein the output is connected to the second portion.

9. The voltage monitor circuit as claimed in claim 7, wherein the first transistor is in series with a fourth transistor.

10. The voltage monitor circuit as claimed in claim 9, wherein the gate terminals of the first and fourth transistors are connected to each other.

11. The voltage monitor circuit as claimed in claim 9, wherein one or more of the first, second, third or fourth transistors is an n-channel metal-oxide-semiconductor (NMOS) field-effect transistor.

12. The voltage monitor circuit as claimed in claim 9, wherein a source terminal of the third transistor is connected to a source terminal of the first or the fourth transistor.

13. The voltage monitor circuit as claimed in claim 7, wherein the comparator comprises a current source.

14. The voltage monitor circuit as claimed in claim 13, wherein the current source is connected to source terminals of the first and third transistors.

15. The voltage monitor circuit as claimed in claim 7, wherein a source terminal of the second transistor is connected to a drain terminal of the third transistor.

16. The voltage monitor circuit as claimed in claim 7, wherein the bistable portion comprises:
a first bistable portion transistor with a drain terminal connected to a drain terminal of the first transistor and a gate terminal connected to a drain terminal of the second transistor; and
a second bistable portion transistor with a drain terminal connected to the drain terminal of the second transistor and a gate terminal connected to the drain terminal of the first transistor.

17. The voltage monitor circuit as claimed in claim 16, wherein the bistable portion further comprises:
a third bistable portion transistor with its gate and drain terminals connected to the drain terminal of the first bistable portion transistor; and
a fourth bistable portion transistor with its gate and drain terminals connected to the drain terminal of the second bistable portion transistor.

18. The voltage monitor circuit as claimed in claim 16, wherein one or more of the group comprising the first, second, third and fourth bistable portion transistors is arranged such that its respective source terminal is connected to a power supply.

19. A comparator comprising:
a first portion including a first transistor with a gate terminal connected to a first input at a first input voltage;
a second portion in parallel with the first portion including a second transistor with a gate terminal connected to a second input at a second input voltage and a third transistor with a gate terminal connected to a third input at a third input voltage, wherein said second and third transistors are in series;
a bistable portion connected to said first and second portions and arranged to produce a logic signal on an output of the comparator, said logic signal having a first logic value at least if the first input voltage is lower than or equal to both the second input voltage and the third input voltage.

20. The comparator as claimed in claim 19, arranged such that said logic signal has a second logic value once the second input voltage or the third input voltage drops below the first input voltage by an offset voltage.

* * * * *